(12) United States Patent
Lim et al.

(10) Patent No.: US 11,346,728 B2
(45) Date of Patent: May 31, 2022

(54) PIEZOELECTRIC SENSOR

(71) Applicant: JOONG ILL INDUSTRIAL CO., LTD., Incheon (KR)

(72) Inventors: Hwangyung Lim, Seoul (KR); Kiryun Park, Anyang-si (KR); Sungho Lee, Seoul (KR)

(73) Assignee: JOONG ILL INDUSTRIAL CO., LTD., Incheon (KR)

( * ) Notice: Subject to any disclaimer, the term of this patent is extended or adjusted under 35 U.S.C. 154(b) by 455 days.

(21) Appl. No.: 16/608,297

(22) PCT Filed: May 25, 2018

(86) PCT No.: PCT/KR2018/005954
§ 371 (c)(1),
(2) Date: Oct. 25, 2019

(87) PCT Pub. No.: WO2018/221894
PCT Pub. Date: Dec. 6, 2018

(65) Prior Publication Data
US 2021/0102850 A1     Apr. 8, 2021

(30) Foreign Application Priority Data

May 29, 2017 (KR) .................... 10-2017-0066198

(51) Int. Cl.
*G01L 1/16* (2006.01)
*H01L 41/047* (2006.01)
(Continued)

(52) U.S. Cl.
CPC ............ *G01L 1/16* (2013.01); *H01L 41/0475* (2013.01); *H01L 41/0533* (2013.01);
(Continued)

(58) Field of Classification Search
CPC ... G01L 1/16; H01L 41/0475; H01L 41/0533; H01L 41/1132; H01L 41/193; H01L 41/29
See application file for complete search history.

(56) References Cited

U.S. PATENT DOCUMENTS

| 2012/0127136 A1* | 5/2012 | Schneider ........... G02F 1/13718 349/23 |
| 2016/0163958 A1* | 6/2016 | Park ..................... H01L 41/047 310/365 |

(Continued)

*Primary Examiner* — Max H Noori
(74) *Attorney, Agent, or Firm* — Korus Patent, LLC; Seong Il Jeong

(57) ABSTRACT

The present invention relates to a piezoelectric sensor using a piezoelectric polyvinylidene fluoride (PVDF) film. As an embodiment, there is proposed a piezoelectric sensor including: a PVDF film; an electrode layer which is formed on the top surface of the PVDF film; a substrate which is provided with a first electrode electrically connected to the electrode layer and a second electrode disposed at a location spaced apart from the first electrode; a non-conductive layer which covers the electrode layer; a first shield film which is electrically connected to the second electrode while being attached to the non-conductive layer; and a second shield film which is attached to the top surface of the PVDF film, and is connected to the first shield film while surrounding a stack of the PVDF film to the non-conductive layer.

4 Claims, 5 Drawing Sheets

(51) Int. Cl.
   *H01L 41/053*   (2006.01)
   *H01L 41/113*   (2006.01)
   *H01L 41/193*   (2006.01)
   *H01L 41/29*    (2013.01)

(52) U.S. Cl.
   CPC ........ *H01L 41/1132* (2013.01); *H01L 41/193* (2013.01); *H01L 41/29* (2013.01)

(56) References Cited

U.S. PATENT DOCUMENTS

| | | | |
|---|---|---|---|
| 2017/0228072 A1* | 8/2017 | Amin | H01L 41/081 |
| 2018/0069167 A1* | 3/2018 | Cho | H01L 41/113 |
| 2020/0046236 A1* | 2/2020 | Liu | H05K 1/028 |
| 2020/0125815 A1* | 4/2020 | Lu | G06V 40/1306 |
| 2020/0133413 A1* | 4/2020 | Chen | H01L 41/1132 |
| 2020/0234021 A1* | 7/2020 | Lu | G06V 40/1306 |
| 2021/0038092 A1* | 2/2021 | Amin | H01L 41/053 |

* cited by examiner

PIEZOELECTRIC SENSOR

TECHNICAL FIELD

The present invention relates to a piezoelectric sensor using a piezoelectric polyvinylidene fluoride (PVDF) film.

BACKGROUND ART

Polyvinylidene fluoride (PVDF) is a ferroelectric polymer which efficiently exhibits piezoelectric and pyroelectric characteristics, and is widely used throughout the industries due to its excellent physicochemical properties. As one of the application fields of PVDF, PVDF is fabricated as a thin and sensitive pressure sensor by using its piezoelectric property, and is used as a medical or sports detection means or sensor for detecting physical activity such as electrocardiogram, respiration, and electromyography. As a physical activity detecting means, it is installed in clothes, a bed, etc. A pressure sensor using a PVDF film may be fabricated in a narrow but long form depending on the site where it will be used.

Korean Patent No. 10-1322838 discloses a piezoelectric sensor using a PVDF film as the above-described type of pressure sensor.

Referring to the conventional technology, electrodes are printed on both surfaces of a PVDF film, and are formed at different locations on front and rear surfaces so that contact portions extending from the respective electrodes do not overlap each other. The electric signals obtained by connecting connectors to the respective contact portions are transmitted to the outside. Furthermore, there is proposed an elastic layer surrounding the outsides of an intermediate product of the lower electrode, the PVDF film and the upper electrode.

The conventional piezoelectric sensor is fabricated by cutting a PVDF film to a required size, printing an electrode on one surface of the cut PVDF film, turning over the PVDF film, printing an electrode, and then attaching elastic layers on the front and rear surfaces of the cut PVDF film, respectively.

Since the electrodes are sequentially printed on the front and rear surfaces of the cut PVDF film after cutting the PVDF film, a process is performed for each cut PVDF film. This process of handling each PVDF film segment is difficult to automate. Even when automated equipment is provided, the number of steps increases, resulting in low productivity.

Moreover, in order to print the electrode patterns on the front and rear surfaces of the cut PVDF film, there is a risk of a short circuit. Accordingly, the electrode patterns cannot be formed to the edges of the PVDF film, and thus all the surfaces of the cut PVDF film cannot be used completely.

The conventional technology is generally configured to sequentially form an electrode layer, an insulating layer, and a shield layer on each of both sides of a film-type piezoelectric material.

DISCLOSURE

Technical Problem

An object of the present invention is to propose a piezoelectric sensor which enables productivity to be improved and has excellent measurement efficiency.

Other detailed objects of the present invention will be apparently appreciated and understood by experts or researchers in the art through the detailed description given below.

Technical Solution

In order to accomplish the above objects, the present invention proposes, as an embodiment, a piezoelectric sensor including: a PVDF film; an electrode layer which is formed on the top surface of the PVDF film; a substrate which is provided with a first electrode electrically connected to the electrode layer and a second electrode disposed at a location spaced apart from the first electrode; a non-conductive layer which covers the electrode layer; a first shield film which is electrically connected to the second electrode while being attached to the non-conductive layer; and a second shield film which is attached to the top surface of the PVDF film, and is connected to the first shield film while surrounding a stack of the PVDF film to the non-conductive layer.

In contrast to the conventional technology, the electrode layer printed on one surface of the PVDF film is used as a first electrode layer, a separate electrode layer is not formed on the opposite surface of the PVDF film, and the second shield film, which is a conductive film to which a conductive adhesive is applied, is used as a second electrode.

In this case, the non-conductive layer may be a non-conductive protective film which is attached to the electrode layer, and the size of the protective film may be larger than that of the electrode layer. By using the non-conductive layer having a larger area than the electrode layer as described above, the end of the electrode layer exposed through a side of a half-finished product having multiple layers can be insulated, and thus a separate additional insulation process can be omitted.

In the conventional technology, in order to form the second electrode, the PDVF film is coated with the electrode layer, and the insulating layer and the shield layer are additionally formed on the PDVF film coated with the electrode layer. In contrast, in the present invention, the shield film to which a conductive adhesive is applied is used as the second electrode. Accordingly, an electrode layer coating process required by the conventional technology can be omitted, and a stack structure can be simplified, thereby enabling process cost to be reduced and also enabling sensitivity to be improved.

Furthermore, the electrode layer may be formed in an area corresponding to the overall surface of a cut PVDF film by printing the electrode layer on PVDF film paper unrolled from a roll and then cutting the PVDF film paper. This can increase the utilization of the PVDF film, and can improve the performance of the sensor.

Moreover, a conductive adhesive layer may be interposed between the PVDF film and the second shield film. Accordingly, the PVDF film and the shield film come into complete surface contact with each other, and signal-to-noise ratio can be significantly improved.

Advantageous Effects

According to an embodiment of the present invention, the productivity of the piezoelectric sensor using the PVDF film can be improved, and the performance of the piezoelectric sensor can be improved.

Other effects of the present invention will be apparently appreciated and understood by experts or researchers in the art through the detailed description given below or during the process of practicing the present invention.

MODE FOR INVENTION

Figure 1:
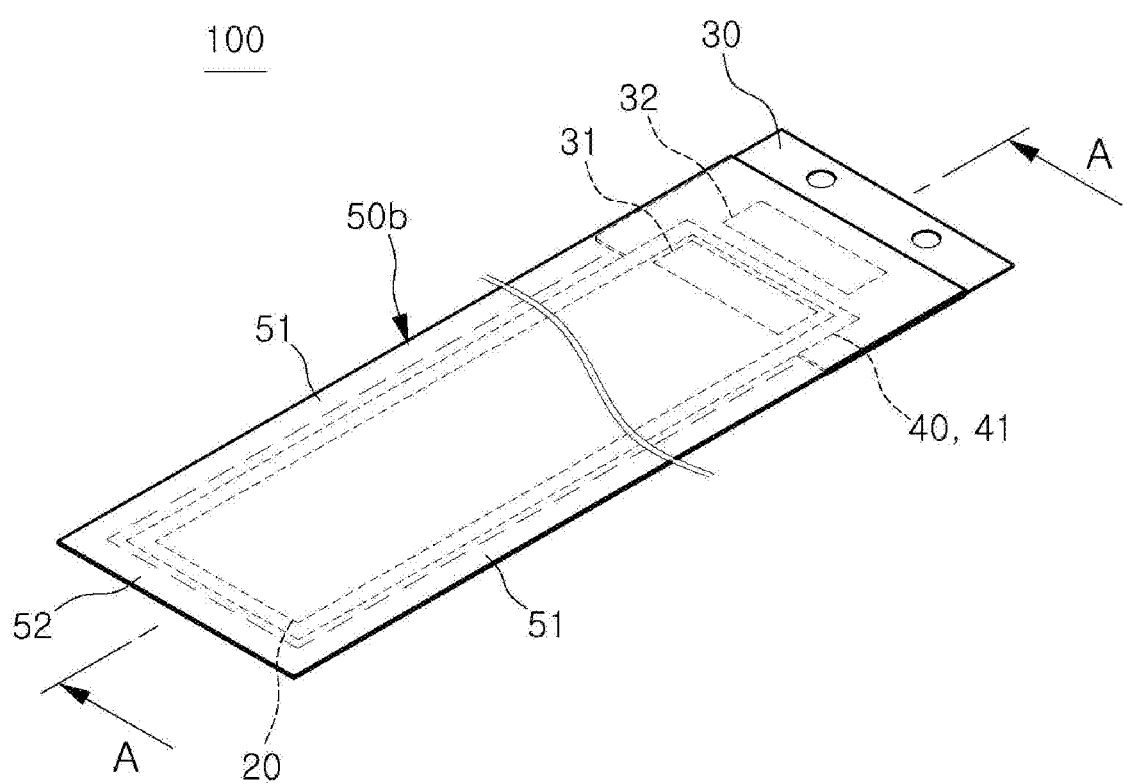
FIG. 1 is a schematic perspective view of a piezoelectric sensor according to an embodiment of the present invention.

The configuration, functionality and operation of a piezoelectric sensor according to the present invention will be described below with reference to the accompanying drawings. In this case, the same reference numerals for the same or similar components throughout the drawings and the embodiments will be used in a unified manner.

Furthermore, in the following description, the terms "first," "second," etc. are used to distinguish components within the same technical range for the sake of convenience. In other words, any one component may be named a "first component" or "a second component" as desired.

The accompanying drawings show applied embodiments of the present invention, and the technical spirit of the present invention should not be limitedly interpreted through the accompanying drawings. When some or all of the illustrations shown in the drawings may be interpreted as not an essential form, shape, or order required for the practice of the invention in view of those skilled in the art, this does not limit the invention described in the claims.

Furthermore, it is noted that in the accompanying drawings, the thickness of each film or layer is intentionally exaggerated for ease of identification.

Furthermore, in the description of the present invention, the PVDF film may be replaced with various piezoelectric materials such as barium titanate and lead zirconate titanate (PZT), and the present invention is not limited to PVDF materials. In the interpretation of the scope of the present invention, the material is not limited to the PVDF material.

FIGS. 1 to 4 relate to a piezoelectric sensor according to an embodiment of the present invention.

A piezoelectric sensor 100 according to an embodiment of the present invention includes a PVDF film 10, an electrode layer 20, a substrate 30, a non-conductive layer 40, and first and second shield films 50a and 50b.

The PVDF film 10 is obtained by forming a piezoelectric material, which generates a voltage in response to applied stress, in the form of a film, and is provided in an appropriate width and length.

Figure 3:
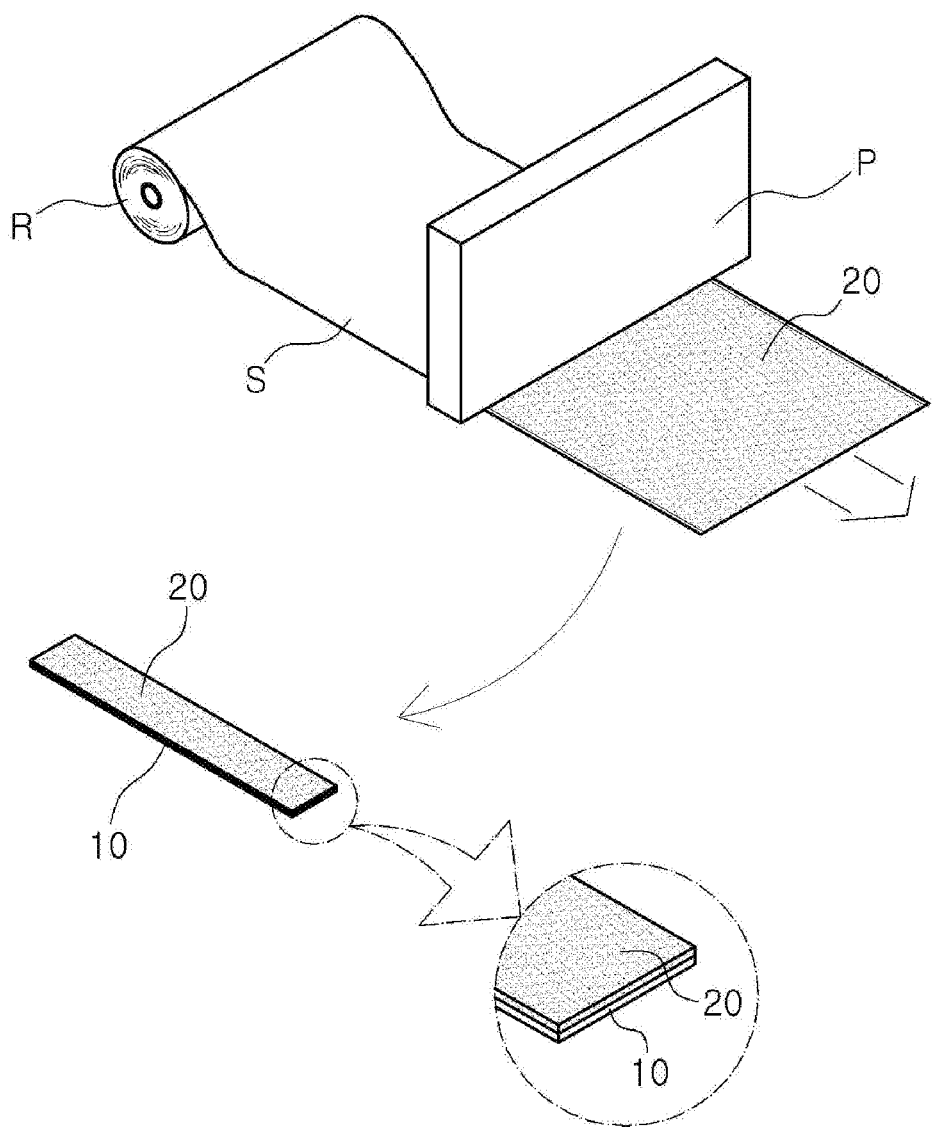
FIG. 3 perspective view schematically showing a process of fabricating a PVDF film and an electrode layer adopted in the embodiment shown in FIG. 1.

The electrode layer 20 configured to accommodate generated current is formed on one surface of the PVDF film 10. Referring to FIG. 3, PVDF film paper S is provided in the form of a roll R, and is continuously supplied from the roll R.

The electrode layer 20 may be formed by printing a conductive paste composition on the PVDF film paper S. Patterning technology for forming the electrode layer 20 and corresponding printing equipment P are already known, and thus descriptions thereof will be omitted.

The electrode layer 20 can be formed on a large amount of PVDF film paper S within a short period of time by forming an electrode layer through printing on the PVDF film paper S continuously supplied from the roll R. In other words, the productivity of an electrode layer formation process is improved.

The PVDF film paper S on which the electrode layer 20 has been formed is cut according to the required sensor size, as shown in the lower portion of FIG. 3. Referring to a stack of the cut PVDF film 10 and the electrode layer 20, the overall area of the PVDF film 10 is the same as the overall area of the electrode layer 20. This makes it possible to use an overall area except a part in contact with a substrate to be described later, thereby increasing the utilization of the PVDF film.

In contrast, in the conventional technology, an electrode layer is formed on a cut PVDF film through printing, and thus the electrode layer is not formed along the circumference of the edge of the PVDF film. Accordingly, the utilization of the PVDF film in the conventional technology is lower than that in the present invention.

Referring back to FIG. 2, on the same surface of the substrate 30, a first electrode 31 and a second electrode 32 are spaced apart from each other in parallel, and a pair of terminals 33 connected to electric wires are formed at locations biased to one side. In this case, any one terminal 33 is electrically connected to the first electrode 31, and the other terminal 33 is connected to the second electrode 32.

The first electrode 31 may be used as a signal electrode which receives minute current, generated in the PVDF film 10, through the electrode layer 20, and the second electrode 32 may be used as a ground electrode.

The substrate 30 may be formed of a flexible printed circuit board (FPCB) which is bendable.

The substrate 30 is located at one end of the PVDF film 10 on which the electrode layer 20 has been formed so that the first electrode 31 close to the edge of the substrate 30 comes into contact with the electrode layer 20. The electrode layer 20 and the first electrode 31 may be connected by various attachment methods using known means such as a conductive adhesive. Alternatively, physical coupling means, such as an eyelet, a rivet, or the like, may be used.

The non-conductive layer 40 may be formed by adhering the protective film 41 onto the electrode layer 20.

In this case, the protective film 41 is flexible and has a non-conductive property, and may be made of one selected from various types of well-known materials.

The non-conductive layer 40 is responsible for the function of insulating the electrode layer 20 from a first shield film 50a which will be described later.

Figure 2:
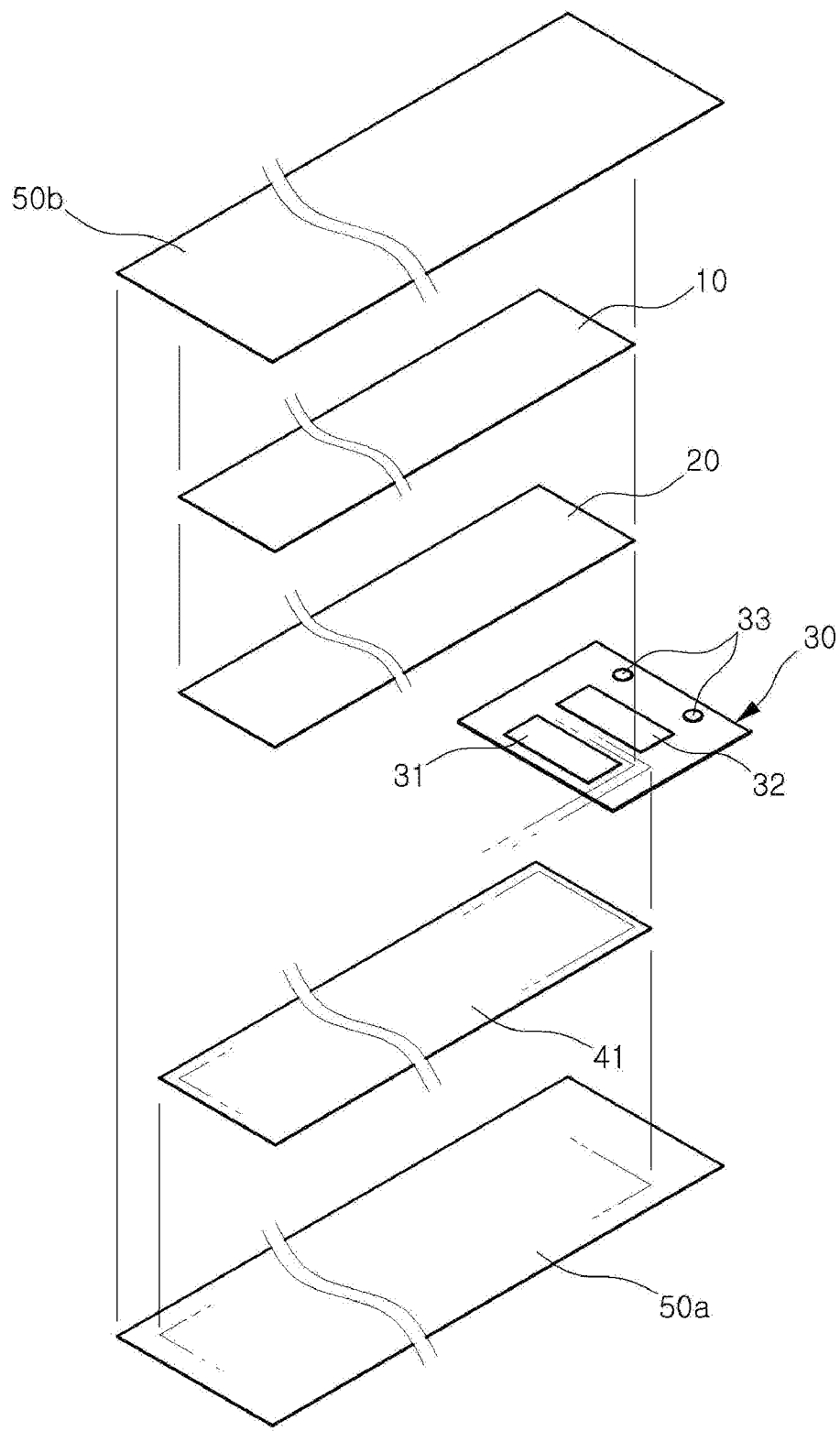
FIG. 2 is an exploded perspective view showing the piezoelectric sensor according to the embodiment shown in FIG. 1.

Moreover, the size of the protective film 41 constituting the non-conductive layer 40 may be larger than that of the electrode layer 20. As shown in FIG. 2, the areas of the PVDF film 10 and the electrode layer 20 are the same. Accordingly, if the non-conductive layer is formed to be the same as the top surface of the electrode layer, the electrode layer is exposed between the PVDF film and the nonconductive layer. The side surface through which the end of the electrode layer is exposed may come into contact with the first shield film 50a which will be described later, and thus they conduct electricity.

Therefore, the size of the protective film 41 is made larger than that of the electrode layer 20 in order to prevent a conductible contact with the first shield film 50a, thereby allowing the end of the electrode layer 20, exposed through the side surface, to be covered with the edge 42 of the protective film 41. As a result, even when additional measures to insulate the side surface through which the electrode layer is exposed are not taken, electric conduction from the exposed end of the electrode layer to the first shield film is prevented.

The first shield film 50a and the second shield film 50b are films made of a material which is bendable and has conductivity, and are provided to surround the outsides of a stack of the PVDF film 10, the electrode layer 20, and the non-conductive layer 40. For this purpose, the size of the first shield film 50a and the second shield film 50b is larger than that of the protective film 41 constituting the non-conductive layer.

In particular, the first shielding film 50a attached on the non-conductive layer 40 is electrically connected to the second electrode 32 of the substrate 30. The first shield film 50a and the second electrode 32 may be connected by an attachment method using one of known means such as a conductive adhesive.

Furthermore, the first shield film 50a may be adhered to the top surface of the substrate 30 around the second electrode 32.

Meanwhile, the second shield film 50b is attached to the top surface of the PVDF film 10. In this case, the edges 51 and one longitudinal end 52 of the second shield film 50b are attached to the edges and one longitudinal end of the first shield film 50a in a conductible manner.

In other words, as shown in FIG. 1, the edges of the first and second shield films 50a and 50b are adhered to each other in a vertical direction, in which case the stack of the PVDF film 10, the electrode layer 20, and the non-conductive layer 40 is in a state of being trapped between the first shield film 50a and the second shield film 50b.

Figure 4:
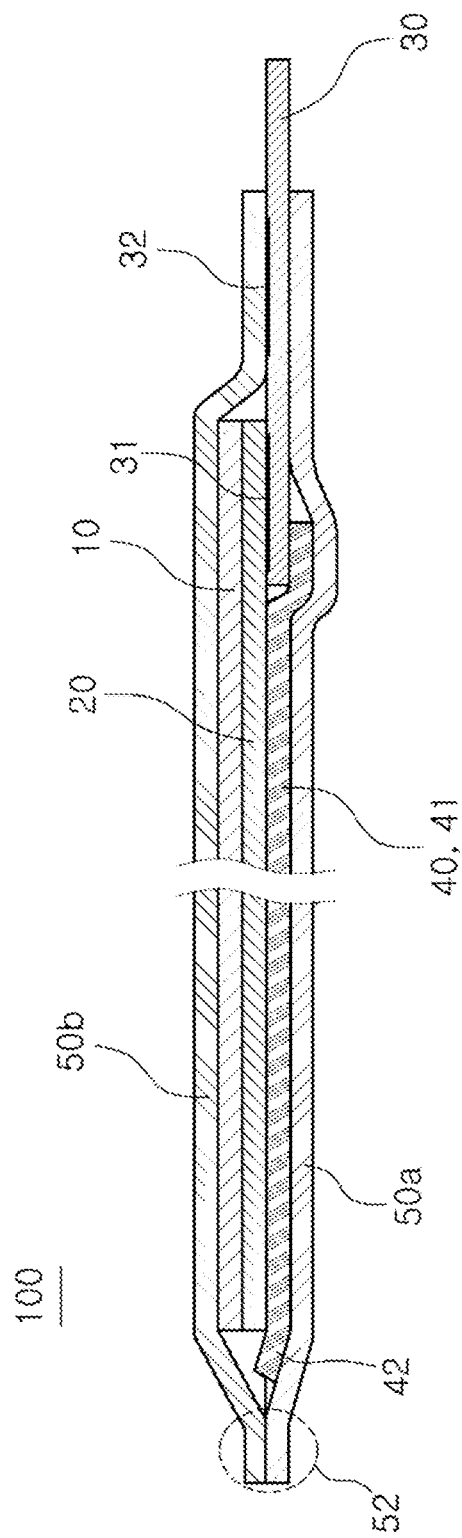
FIG. 4 is a sectional view of the embodiment shown in FIG. 1.

Referring to FIG. 4, the second shield film 50b is electrically connected to the second electrode 32 through the first shield film 50a along the edge circumferences 51 and 52 and thus grounded. The current generated as stress is applied to the PVDF film 10 flows to the electrode layer 20 connected to the bottom surface of the PVDF film 10. The electrode layer 20 is connected to the first electrode 31, and can conduct the current, generated in the PVDF film 10, to the outside through the substrate 30.

Moreover, although not shown, additional coating configured to surround the outsides of the first and second shield films or the attachment of an additional functional film can be performed. The additional coating, etc. may prevent the contamination of the first and second shield films, or block noise signals such as external static electricity from being transmitted to the first and second shield films. The additional coating or functional film may be formed in a multiple manner depending on the embodiment.

Figure 5:
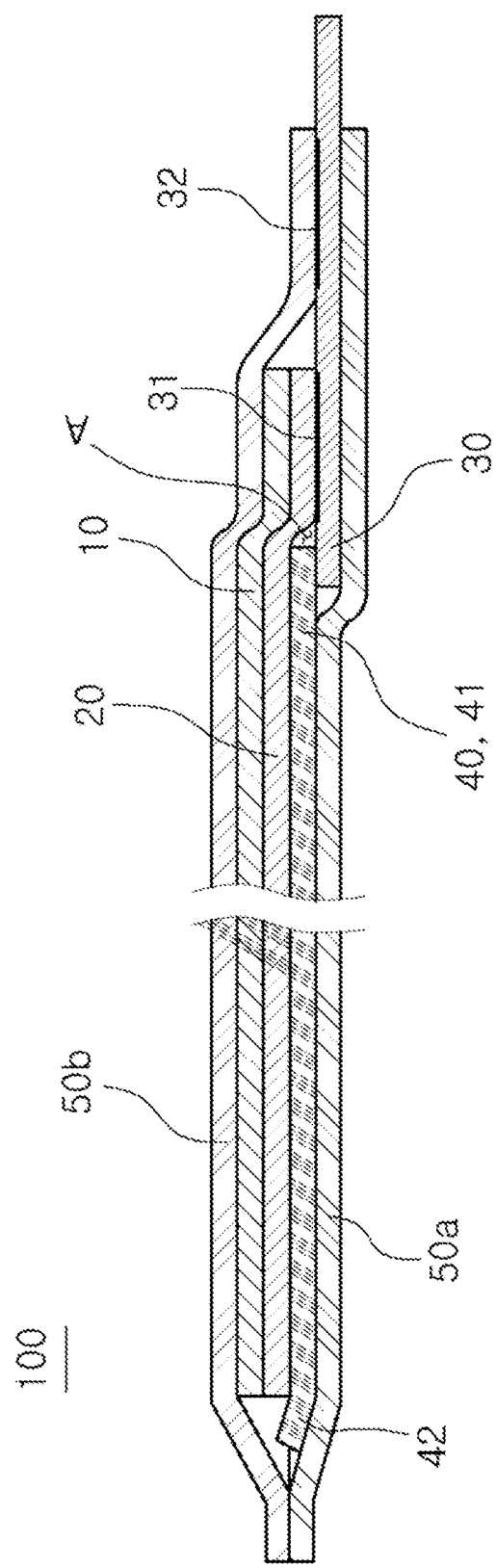
FIG. 5 is a sectional view of a piezoelectric sensor according to another embodiment of the present invention.

Meanwhile, FIG. 5 relates to a piezoelectric sensor according to another embodiment of the present invention.

A piezoelectric sensor 100 according to another embodiment of the present invention includes a PVDF film 10, an electrode layer 20, a substrate 30, a non-conductive layer 40, and first and second shield films 50a and 50b. The technical features of the above-described embodiment are included as they are as long as they do not conflict with the items described below.

In the embodiment shown in FIG. 5, the protective film constituting the nonconductive layer 40 is located between the electrode layer 20 and the substrate 30. Since an end of the protective film 41 does not reach the first electrode 31 of the substrate 30, the electrode layer 20 may be completely connected to the first electrode 31.

In the embodiment presented in FIG. 5, as the protective film 41 covers the insulating layer 20 over the substrate 30, the electrode layer 20 made of a conductive polymer material is exposed to air and oxidized, and thus a phenomenon in which sensor performance is deteriorated is minimized. More specifically, as the thickness of the protective film 41 is considerably thin in practice, a separation space A between the substrate 30 and the electrode layer 20 caused by the thickness of the protective film 41 is almost absent.

In contrast, in the embodiment shown in FIG. 4, a part of the electrode layer 20 is exposed to air because the protective film 41 is disposed over the thick substrate 30. The piezoelectric sensors according to the embodiments of the present invention use the substrate 30 having the first and second electrodes 31 and 32 on one surface thereof. The piezoelectric sensors adopt a configuration in which the electrode layer 20 is connected to the first electrode 31 and the first shield film 50a is connected to the second electrode 32.

Since the above substrate and the above stack structure are adopted, the process of turning a half-finished product over may be minimized in the process of manufacturing the piezoelectric sensor using the PVDF film 10 as a starting material. In other words, the formation of the electrode layer 20 on the PVDF film 10, the connection of the substrate 30 (the connection between the first electrode 31 and the electrode layer 20), the formation of the non-conductive layer 40, and the attachment of the first shielding film 50a (the connection between the second electrode 32 and the first shielding film 50a) may be performed in a continuous process without turning a half-finished product over. Thereafter, the piezoelectric sensor 100 is completed by turning the semi-finished product over and attaching the second shielding film 50b. Therefore, productivity is increased by the simplification of the process.

Furthermore, in forming the electrode layer 20 on the PVDF film 10 by printing, only a single electrode layer 20 is printed. According to the conventional technology, an electrode layer needs to be printed on each of the front and back surfaces of the PVDF film once. In contrast, the present invention requires the printing of only one electrode layer, and thus productivity is improved.

In terms of the performance of the piezoelectric sensor, the piezoelectric sensor 100 according to the embodiment of the present invention reduces the number of stack components of the sensor having a multi-layer structure—in the conventional technology, an electrode layer, an insulating layer, and a shield layer are formed on each of both surfaces of the PVDF film—by one in such a manner that the second shield film 50b is response for the function of one electrode layer compared to the conventional technology. Accordingly, the PVDF film can react even to a small stress, thereby providing the effect of improving the sensitivity of the piezoelectric sensor.

Furthermore, the first and second shield films 50a and 50b are configured to surround the PVDF film 10, the electrode layer 20 configured to accommodate current generated in the PVDF film 10, and part of the substrate on which the first electrode 31 is formed, and may reduce the influence of external noise on the above-described components. Accordingly, sensitivity is improved by improving the signal-to-noise ratio (the S/N ratio) of the piezoelectric sensor.

In FIG. 4 or 5, an adhesive layer (not shown) may be interposed between the PVDF film 10 and the second shield film 50b. The adhesive layer is made of a material which has flexibility and is not broken when the piezoelectric sensor is used. One of the known resins may be selected and used as the material of the adhesive layer.

Since the adhesive layer is interposed, the second shield film 50*b* comes into surface contact with the top surface of the PVDF film 10, and thus electrical signals of the PVDF film may be transmitted to the substrate without distortion.

Moreover, the adhesive layer may be formed of a conductive adhesive.

In this case, the conductive adhesive may be a mixture obtained by mixing one of various resins, such as an acrylic resin, a silicone resin, an epoxy resin, and the like, with a conductive filler, such as a metal powder, a carbon powder, a conductive polymer, or the like. A commercially available product may be used as the conductive adhesive.

The adhesive layer formed of the conductive adhesive forms a complete electrical connection between the PVDF film 10 and the second shield film 50*b* compared to a different type of adhesive layer. Accordingly, the adhesive layer formed of the conductive adhesive provides the effect of further improving signal-to-noise ratio compared to a case where a non-conductive adhesive layer is applied.

The invention claimed is:

1. A piezoelectric sensor comprising:
a PVDF film;
an electrode layer which is formed on a top surface of the PVDF film;
a substrate which is provided with a first electrode electrically connected to the electrode layer and a second electrode disposed at a location spaced apart from the first electrode;
a non-conductive layer which covers the electrode layer;
a first shield film which is electrically connected to the second electrode while being attached to the non-conductive layer; and
a second shield film which is attached to a top surface of the PVDF film, and is connected to the first shield film while surrounding a stack of the PVDF film to the non-conductive layer.

2. The piezoelectric sensor of claim 1, wherein:
the non-conductive layer is a non-conductive protective film which is attached to the electrode layer; and
a size of the protective film is larger than that of the electrode layer.

3. The piezoelectric sensor of claim 1, wherein the electrode layer is formed in an area corresponding to an overall surface of a cut PVDF film by printing the electrode layer on PVDF film paper unrolled from a roll and then cutting the PVDF film paper.

4. The piezoelectric sensor of claim 1, wherein a conductive adhesive layer is interposed between the PVDF film and the second shield film.

* * * * *